(12) United States Patent
Gernhardt et al.

(10) Patent No.: US 7,155,815 B2
(45) Date of Patent: Jan. 2, 2007

(54) ELECTRICAL CONTACTING METHOD

(75) Inventors: Angelika Gernhardt, Neuss (DE); Thomas Goulet, Erkrath (DE); Carsten Menzel, Duisburg (DE); Waldemar Ollik, Rheinberg (DE)

(73) Assignee: Novar GmbH (DE)

( * ) Notice: Subject to any disclaimer, the term of this patent is extended or adjusted under 35 U.S.C. 154(b) by 196 days.

(21) Appl. No.: 10/859,114

(22) Filed: Jun. 3, 2004

(65) Prior Publication Data
US 2004/0248439 A1 Dec. 9, 2004

(30) Foreign Application Priority Data
Jun. 5, 2003 (DE) ................. 103 25 550

(51) Int. Cl.
*H03K 3/34* (2006.01)
(52) U.S. Cl. .......................... 29/825; 29/412; 29/830; 29/840; 29/852; 361/752; 439/83
(58) Field of Classification Search ................ 29/412, 29/415, 832, 834, 837, 840, 846, 852–853, 29/825, 830, 849; 174/255; 361/752, 753, 361/760, 784; 439/66, 74, 79, 83
See application file for complete search history.

(56) References Cited

U.S. PATENT DOCUMENTS

| | | | |
|---|---|---|---|
| 4,790,894 A | 12/1988 | Homma et al. | |
| 4,821,007 A * | 4/1989 | Fields et al. | 29/846 |
| 5,140,745 A * | 8/1992 | McKenzie, Jr. | 29/852 |
| 5,377,081 A * | 12/1994 | Bizen et al. | 361/818 |
| 5,570,505 A | 11/1996 | Downie et al. | |
| 5,938,455 A * | 8/1999 | Glovatsky et al. | 439/74 |
| 6,496,384 B1 * | 12/2002 | Morales et al. | 29/840 |
| 6,518,088 B1 | 2/2003 | Heerman et al. | |
| 6,534,726 B1 * | 3/2003 | Okada et al. | 29/852 |
| 6,727,116 B1 * | 4/2004 | Poo et al. | 438/106 |

FOREIGN PATENT DOCUMENTS

| | | |
|---|---|---|
| DE | 35 22 647 A1 | 1/1987 |
| EP | 0 878 987 A1 | 11/1998 |
| GB | 2 322 974 A | 9/1998 |

* cited by examiner

*Primary Examiner*—Minh Trinh
*Assistant Examiner*—Donghai D. Nguyen
(74) *Attorney, Agent, or Firm*—Edell, Shapiro & Finnan, LLC

(57) ABSTRACT

A method for contacting printed conductors terminating at the edge of a circuit board with printed conductors of a MID component includes: on a panel which includes the circuit board, producing the printed conductors of the circuit board in a layout in which the printed conductors are extended past a partition line which defines the edge of the circuit board; providing the panel with through holes along the partition line in the region of the printed conductors; electroplating through the through holes; isolating the circuit board from the panel; and positioning the circuit board in relation to the MID component and soldering the printed conductors of the circuit board to the printed conductors of the MID component. Rear electrical contacting areas are provided on a back side of the panel near the partition line, and the printed conductors are connected to the rear electrical contacting areas via the through holes.

14 Claims, 4 Drawing Sheets

ELECTRICAL CONTACTING METHOD

CROSS REFERENCE TO RELATED APPLICATIONS

This application claims priority under 35 U.S.C. §119(e) to German Application No. DE 10325550.8, filed on Jun. 5, 2003, and titled "Electrical Contacting Method," the entire contents of which are hereby incorporated by reference.

FIELD OF THE INVENTION

The present invention relates to a method for electrically contacting printed conductors terminating on at least one edge of a circuit board with printed conductors located on an adjoining component made of a thermoplastic in MID technology.

BACKGROUND

Electrical components may be provided as molded injection devices (MID) with desired printed conductors, i.e., when manufactured in MID technology, using different methods, e.g., a masking method, in two-component injection molding with subsequent electroplating, through laser direct structuring, through coating the back of a film, or through hot stamping. In contrast to conventional circuit boards made of fiberglass-reinforced plastic or the like, MID components manufactured in this way are three-dimensional molded parts having an integrated printed conductor layout and possibly further electronic or electromechanical components. The use of MID components of this type, even if the components have only printed conductors and are used to replace conventional wiring inside an electrical or electronic device, saves space, allowing the relevant device to be made smaller, and lowers the manufacturing costs by reducing the number of assembly and contacting steps.

However, MID components are not suitable as a replacement for classical circuit boards, on which numerous electronic components are positioned with a high packing density and very closely spaced printed conductors in surface mount device (SMD) technology. The problem frequently arises of contacting one or more such circuit boards with a MID component. Current methods, namely soldering wire bridges or mechanical contacts via multiple connectors, socket connectors, conductive rubber strips, etc., are materially complex, sometimes bulky, costly, and occupy valuable manufacturing time.

SUMMARY OF THE INVENTION

The present invention is based on the object of providing an especially efficient and reliable contacting method and manufacturing techniques associated therewith. According to the present invention, a method for electrically contacting printed conductors terminating on at least one edge of a circuit board with printed conductors applied to a MID component includes: on a panel which includes at least one circuit board, including the circuit board with printed conductors, and is copper-laminated on at least one side, producing the printed conductors of the circuit board in a layout in which the printed conductors are extended past a partition line which defines the edge of the circuit board that is to adjoin the MID component; providing the panel with through holes along the partition line in at least the region of the printed conductors; electroplating the through holes to provide contacting through; isolating the circuit board from the panel; and positioning the circuit board in relation to the MID component and soldering the printed conductors of the circuit board to the printed conductors of the MID component.

The panel can include at least first and second circuit boards in a layout in which the edges of the first and second circuit boards that are to adjoin MID components adjoin one another along a shared partition line, wherein the printed conductors of the first and second circuit boards bridge the shared partition line.

An important aspect of the present invention is therefore to extend the printed conductors to be contacted on the panel, i.e., the sheet from which the circuit board(s) subsequently will be isolated, over the eventual edge of the circuit board(s) in the same raster in which the printed conductors of the MID component end at this edge, provide these printed conductors with plated-through through holes precisely at the height of the eventual edge, and only then break or stamp the circuit boards out of the panel, for example, so that each printed conductor ends at a metal-plated semi-cylindrical surface. In the case of a single board, it is sufficient if the panel is larger than the circuit board by an appropriate edge strip. This edge strip is provided with the through holes made into through contacts at the height of the eventual, actual edge of the board. The excess edge strips are subsequently broken off. If, as is typical, multiple circuit boards are to be produced simultaneously, it is significantly more favorable to proceed according to the above-mentioned option of having multiple circuit boards formed on the panel. At least two circuit boards then lie head-to-head in relation to one another on the panel, e.g., in such a way that the layout of one circuit board is produced on the panel rotated by 180° around the vertical axis in relation to the other circuit board. A printed conductor raster is expediently produced over essentially the entire length of the relevant edge, independently of how many printed conductors conduct electric signals. This is also true for the corresponding edge of the MID component. In this way, the maximum strength is achieved for the mechanical connection between the circuit board and the MID component.

A circuit board prepared in this way may be soldered to the printed conductors of the adjoining MID component without problems. This type of contacting has been shown to be electrically safe and reliable and extremely mechanically stable. The suggested method requires no additional connection elements and is cost-saving for this reason alone. Simultaneously, it also saves space on the circuit board and dispenses with the additional manufacturing steps which the contacting methods previously known from the related art required.

The contacting reliability may be increased practically without additional outlay if the printed conductors of the circuit board are expanded to contacting areas, i.e., pads, at least at the edge. Where no printed conductors are necessary for circuitry reasons, it is sufficient to implement pads only at the edge.

An improvement at a very low additional manufacturing outlay of the mechanical connection between the circuit board and the MID component simultaneously provided by the soldering is to provide the back of the panel with electrical contacting areas (pads) congruent to the printed conductors on the front at least in the region of the partition line. The latter pads may continue in rear, signal-conducting printed conductors on circuit boards equipped on both sides.

It is expedient in this case if the front printed conductors are connected to the rear contacting areas or pads, even if they continue in rear printed conductors, via metal-plated and through-plated holes. This through plating produces a reliable electrical connection to the relevant printed conductor of the MID component even if the metal plating of the corresponding edge semi-cylindrical area, because of insufficient edge enclosure or for other reasons, produces no or only insufficient electrical connection between the front printed conductor and/or its expansion into a contacting area and the rear printed conductor or contacting area of the circuit board.

The mechanical strength is favorable above all if the circuit board and the MID component are positioned in relation to one another so that the printed conductors of the circuit board and of the MID component to be contacted with one another are offset from one another in height by approximately the thickness of the circuit board and overlap. In this way, a soldered connection with a larger area is provided between the circuit board and the MID component.

The printed conductors of the circuit board and those of the MID component may particularly be soldered with one another according to the reflow method. Other contacting methods such as laser soldering, vapor-phase soldering, robot soldering, or conductive gluing may, however, also be used. The application of soldering paste required beforehand may be performed, for example, according to the screen printing method or in dots using dispenser robots.

The panel or the circuit board may be at least partially equipped with the printed circuits of the MID component even before the contacting, so that in a subsequent reflow process, for example, both the equipped components may be soldered to the printed conductors of the circuit board and the printed conductors may be soldered to the MID component in one step.

The contacting method suggested is especially suitable in connection with MID components to which the printed conductors are applied, for example, in the hot stamping method or through laser direct structuring.

The electrical or electronic device resulting from this manufacturing process comprises: a circuit board including: first conductive areas on a first side of the circuit board adjacent an edge of the circuit board; corresponding second conductive areas on a second side of the circuit board adjacent the edge of the circuit board; a plurality of conductive edge areas on the edge of the circuit board respectively connecting the first conductive areas to the corresponding second conductive areas; and a plurality of through holes having conductive surfaces extending through the circuit board between the first conductive areas and the corresponding second conductive areas; and a MID component including a surface with conductive areas corresponding to the first conductive areas of the circuit board, wherein the circuit board and the MID component are arranged such that the corresponding second conductive areas overlap the conductive areas on the surface of the MID component, and the circuit board and the MID component are attached via solder in the through holes and along the conductive areas, such that the first conductive areas are electrically connected to the conductive areas on the surface of the MID component via at least one of the through holes and the conductive edge areas.

BRIEF DESCRIPTION OF THE FIGURES

The method according to the present invention will be explained in the following as an example on the basis of the schematically simplified drawings.

DETAILED DESCRIPTION

Figure 1:
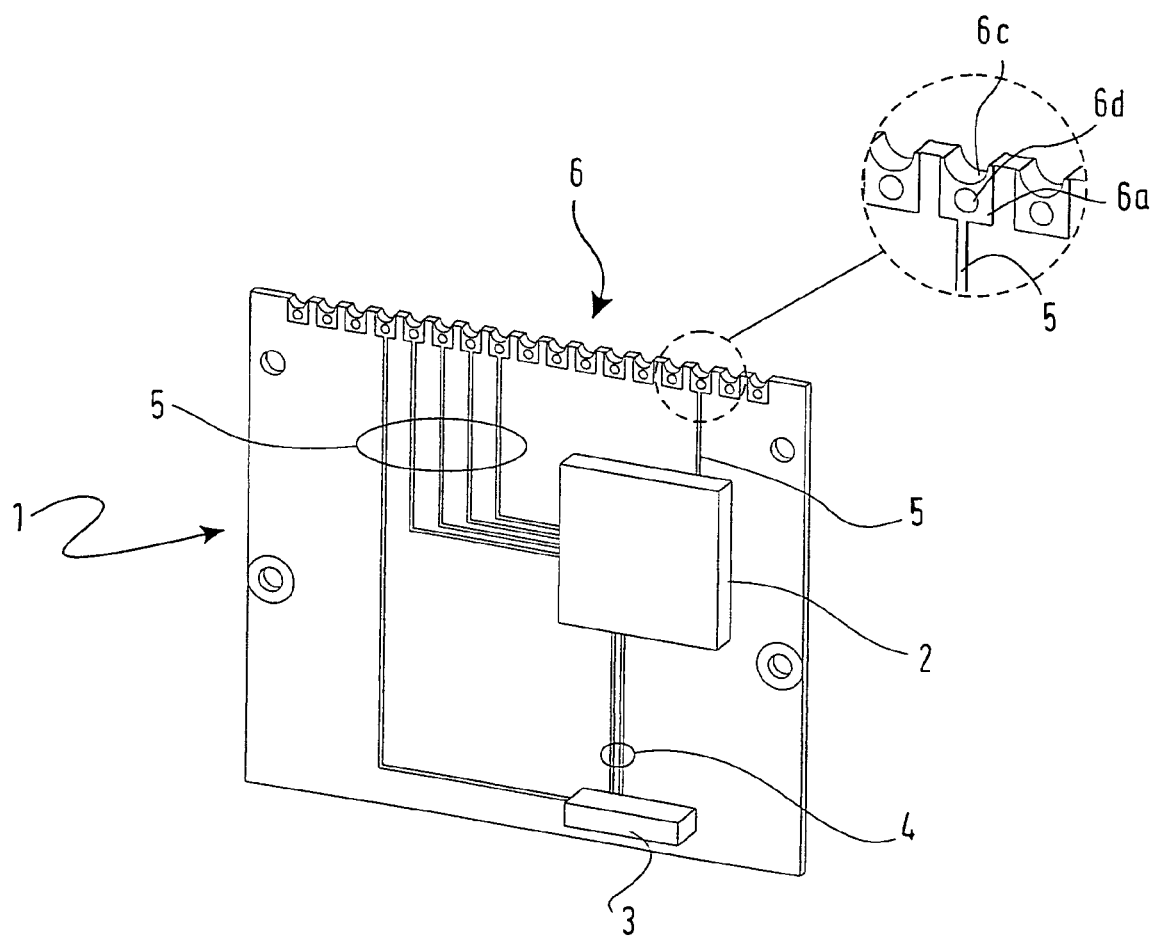
FIG. 1 shows a perspective view of a circuit board.

FIG. 1 shows a simplified perspective view of a circuit board 1 which is made of fiberglass-reinforced epoxide resin for example and which is equipped with components 2 and 3 (shown only symbolically in FIG. 1), which are connected to one another via printed conductors 4. Power supply and signal terminals of the components 2 and 3 extend to edge contacts 6 at the upper edge of the circuit board via further printed conductors 5. There, each printed conductor passes into widened contacting area 6a (cf. the enlarged detail in FIG. 1). The contacting areas 6a are positioned in a predetermined raster, along nearly the entire upper edge of the circuit board 1, even if the contacting areas are not necessary as extended electrical terminals. The circuit board 1 may also be provided with printed conductors and equipped with electrical components on its back.

Figure 2:
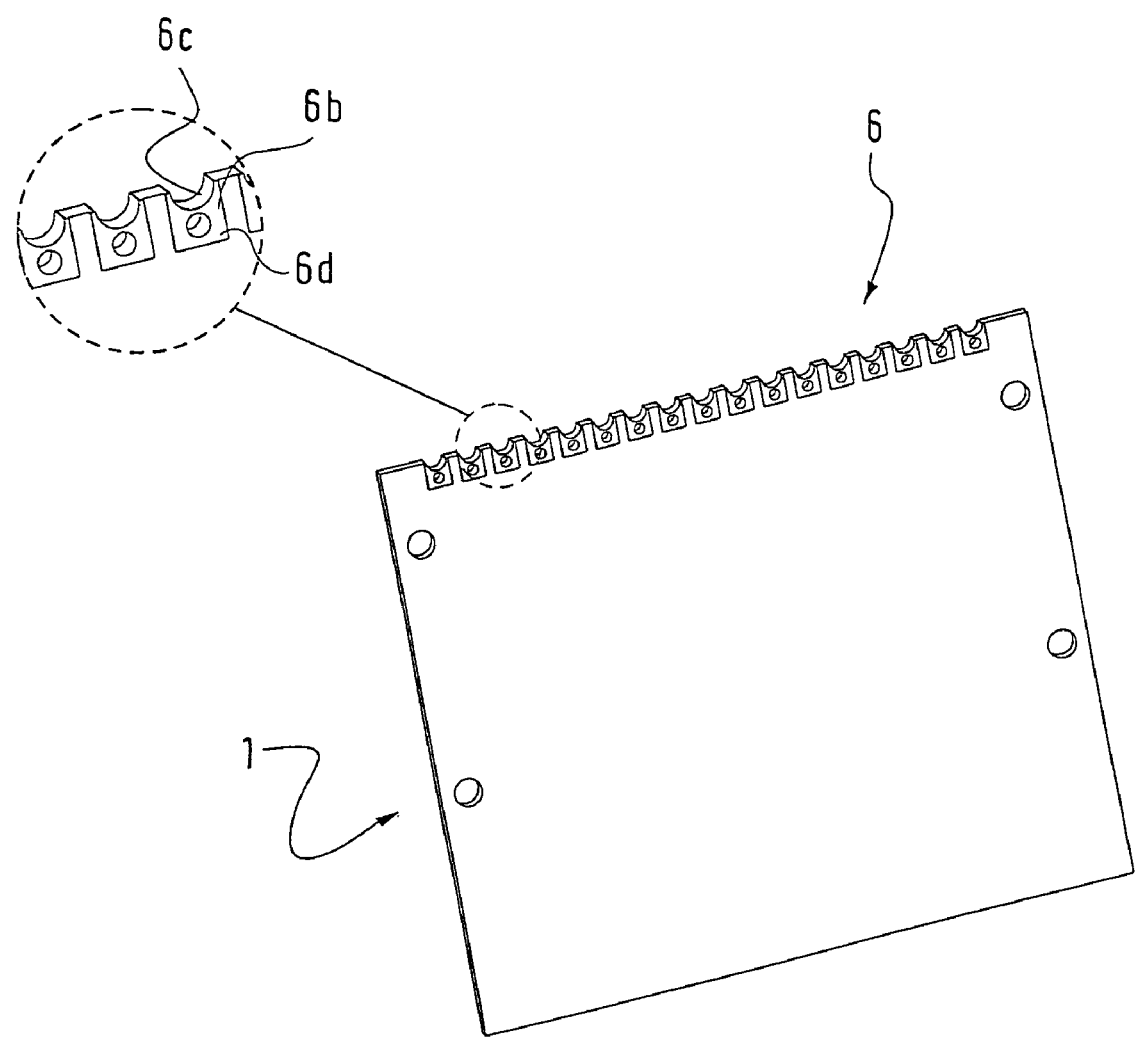
FIG. 2 shows the circuit board of FIG. 1 in the rear view.

Even if the circuit board is provided with printed conductors and components only on the front, as shown in this exemplary embodiment, there are identical contacting areas 6b diametrically opposite the contacting areas 6a on the back of the circuit board, as shown in FIG. 2. The contacting areas 6a and 6b are connected to one another both via semi-cylindrical areas 6c, which are implemented in the upper edge of the circuit board 1, and additionally via through-plated holes 6d.

Figure 3:
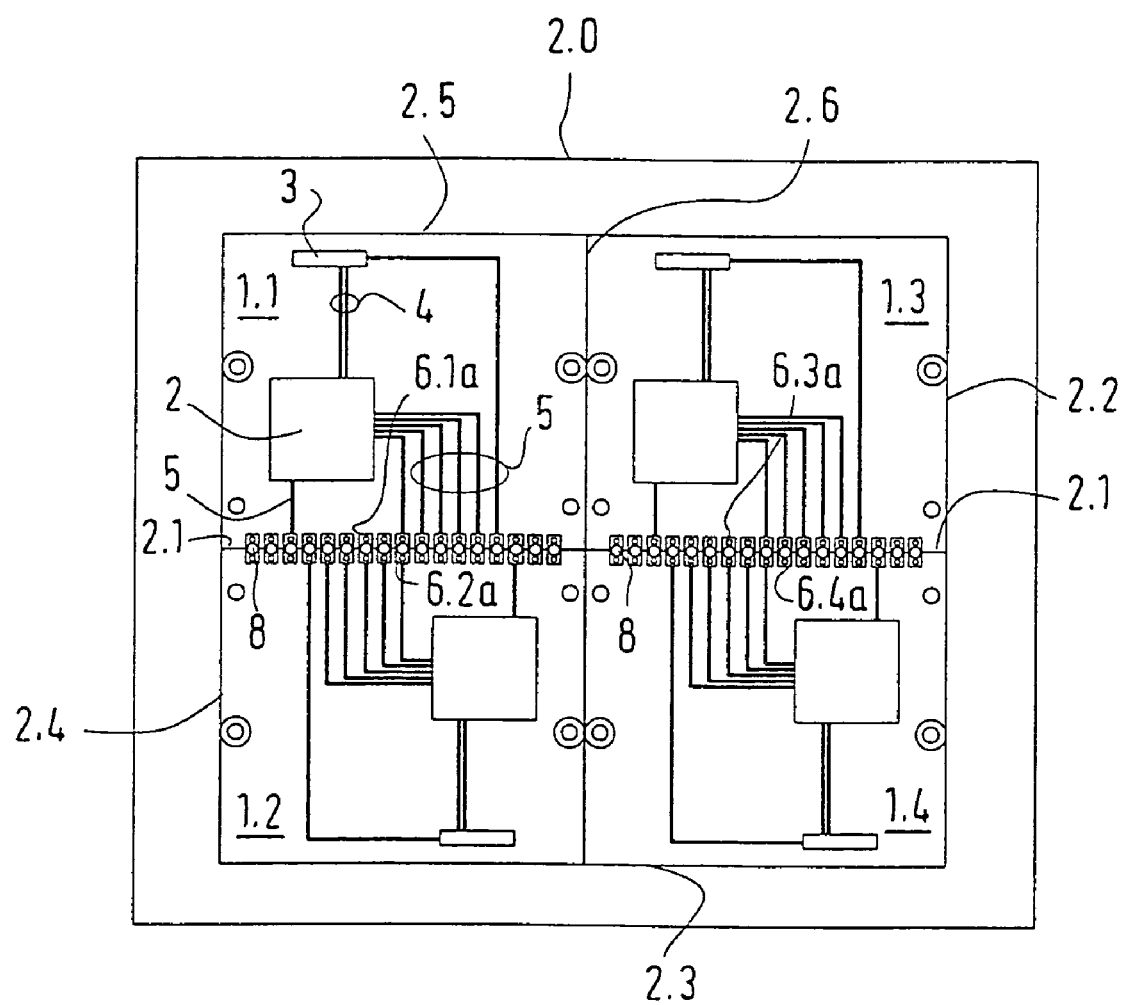
FIG. 3 shows a panel including four circuit boards of the type shown in FIG. 1.

The edge contacts 6 of the circuit board 1 are produced according to the method explained in connection with FIG. 3. On a panel 20 which is copper-laminated on both sides, a layout, which corresponds to four identical boards 1.1 through 1.4 shown in FIG. 3 only for clarification and already equipped with the components 2 and 3 on the front, is produced on the front and back according to one of the known methods. The layout is designed in such a way that two boards at a time, namely 1.1 and 1.2 as well as 1.3 and 1.4, lie with their edges carrying the edge contacts adjoining one another. In this example, the layouts of the boards 1.2 and 1.4 are therefore rotated by 180° around the vertical axis in relation to the layout of the boards 1.1 and 1.3. Before or after the production of the printed conductors 4 and 5, including the contacting areas 6a, as well as the rear printed conductors and contacting areas (not visible in FIG. 3), the panel is provided along the partition line 2.1, over which the contacting areas 6.1a, 6.2a and 6.3a, 6.4a extend, with through holes 8 and the holes 6d at the height of these contacting areas and in the same raster. In other words, for each joint contacting area (e.g., 6.1a/6.2a or 6.3a/6.4a), there is formed a through hole 8 centered on the partition line, and two holes 6d are respectively formed on opposite sides of each through hole 8 such that, for each joint contacting area, the through hole 8 and its corresponding holes 6d are centered on a line extending substantially perpendicular to the partition line. In this step, all of the other holes required, particularly the holes necessary for equipping and contacting the components 2 and 3, are also manufactured. Subsequently, all of the holes, i.e., also the through holes 8 and the holes 6d, are electroplated through according to one of the typical methods. In the last step, the boards 1.1 through 1.4 are stamped out of the panel 20 along the partition lines 2.1 through 2.6. In the region of the particular edge of the circuit boards 1.1 through 1.4 to be contacted, the contacting areas 6a, 6b shown in FIG. 1 are then connected so they conduct electricity via the semi-cylindrical metal-plated areas 6c and additionally via the through-plated holes 6d. Even if the metal plating of the semi-cylindrical areas 6c, which is only a few microns thick, is damaged in the course of the stamping, the through plating in the region of the holes 6d ensures the electrical connection of the particular contacting area 6a to the rear contacting area 6b.

Figure 4:
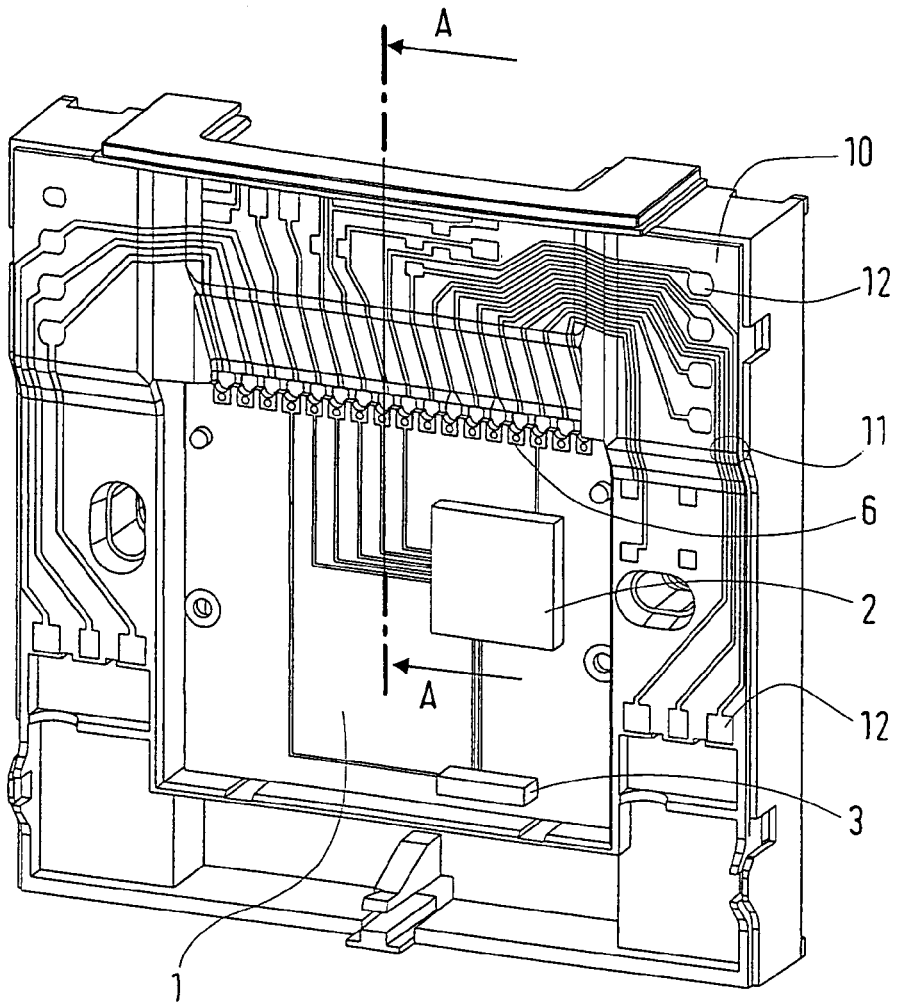
FIG. 4 shows a finished circuit board, mechanically and electrically connected to a component implemented in MID technology.

The circuit board 1 is intended for electrical and mechanical connection to an electrical component manufactured in MID technology. FIG. 4 shows an example of such an MID component in the form of a housing lower part 10, whose three-dimensional surface carries numerous printed conductors 11, produced according to the hot stamping method or through laser direct structuring, which end at contacting areas 12 to which further electrical components (not shown) are soldered. The printed conductors 11 are soldered to the edge contacts 6 of the circuit board 1. The soldering according to any of the known methods is used both for electrical contacting and for mechanical fixing of the circuit board 1 in the housing lower part 10.

Figure 5:
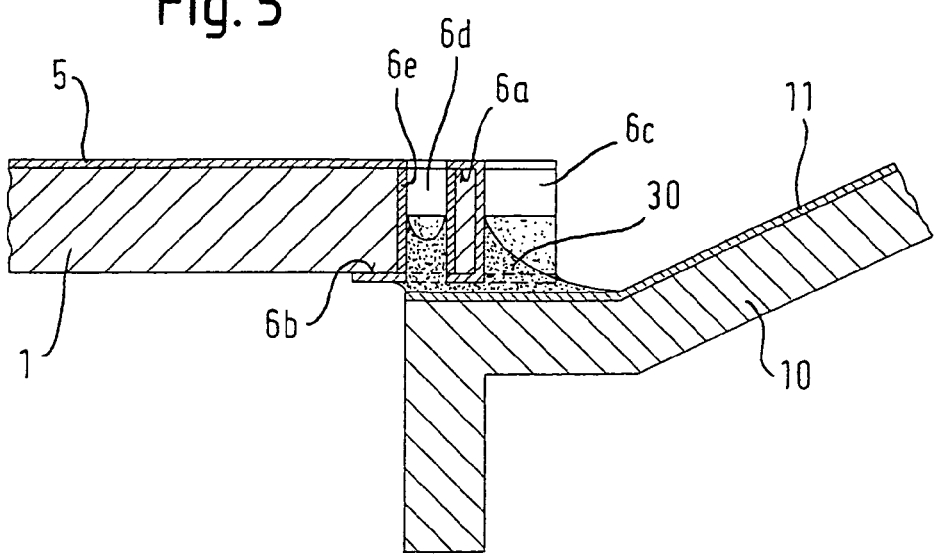
FIG. 5 shows one of the contact points greatly enlarged in a section along the line A—A in FIG. 4.

FIG. 5 shows the soldered connection in an enlarged section along the line A—A in FIG. 4. The board 1 lies with its edge overlapping the edge of the MID component 10. The upper contacting area 6a is connected to the lower contacting area 6b via the metal-plated, semi-cylindrical area 6c and additionally via the metal plating 6e of the hole 6d. The printed conductor 11 of MID component 10 is connected via the solder 30 both to the semi-cylindrical area 6c and to the lower contacting area 6b and, because of capillary action, the solder fills at least the gap between this lower contacting area 6b and the end of the printed conductor 11. Because of the capillary action, the solder 30 also rises into the hole 6d.

The invention claimed is:

1. A method of connecting a circuit board to a molded injection device (MID) component including printed conductors comprising the steps:
    (a) providing a panel having a first side and a second side and including:
        a first circuit board including printed conductors,
        a second circuit board including printed conductors, and
        a partition line operable to permit the separation of the first circuit board from the second circuit board;
    (b) forming a first electrical contact area on the first panel side within an area including the partition line;
    (c) forming a second electrical contact area on the second side of the panel within an area including the partition line;
    (d) forming a first set of through holes along the partition line, wherein the first set of through holes extend between the first and second contact areas;
    (e) forming a second set of through holes offset from the partition line, wherein the second set of through holes extend between the first and second contact areas;
    (f) electroplating the first and second sets of through holes;
    (g) separating the first circuit board from the panel along the partition line, thereby splitting the first set of through holes; and
    (h) connecting at least one of the first circuit board and the second circuit board to the MID component.

2. The method of claim 1, wherein the first and second circuit boards are formed on the panel such that the edges of the first and second circuit boards operable to connect to the MID component share the partition line, and wherein the printed conductors of the first and second circuit boards bridge the shared partition line.

3. The method of claim 1, wherein the first circuit board and the MID component are positioned in relation to one another such that the printed conductors of the circuit board are offset in height from the printed conductors of the MID component by the thickness of the circuit board and overlap the printed conductors of the MID component.

4. The method of claim 1, wherein the printed conductors of the first circuit board are soldered to the printed conductors of the MID component according to the reflow method.

5. The method of claim 1, wherein the panel or the first circuit board is at least partially mounted with components before the contacting with the printed conductors of the MID component.

6. The method of claim 1, wherein the printed conductors for MID components are applied via hot stamping.

7. The method of claim 1, wherein the printed conductors for MID components are applied via laser direct structuring.

8. The method of claim 1, wherein step (h) comprises (h.1) connecting at least one of the first and second circuit boards to the MID component via soldering.

9. The method of claim 1, wherein the first and second sets of through holes provide an electrical connection from the first electrical contact area to the second electrical contact area.

10. The method of claim 1, wherein:
    the partition line defines an edge of the each circuit board, and
    the defined edge is operable to connect to the MIDI component.

11. The method of claim 1, wherein the first circuit board and the second circuit board are positioned opposite each other along the partition line.

12. The method of claim 1, wherein the second set of through holes is disposed on the first and second circuit boards inboard of the first set of through holes.

13. The method of claim 1, wherein the first set of through holes includes a through hole centered on the partition line, and the second set of through holes includes first and second through holes, each located on opposite sides of the centered through hole.

14. The method of claim 13, wherein the centered through hole and the opposed through holes are disposed along a line extending substantially perpendicular to the partition line.

* * * * *